United States Patent
Meyer et al.

(10) Patent No.: US 8,421,226 B2
(45) Date of Patent: Apr. 16, 2013

(54) DEVICE INCLUDING AN ENCAPSULATED SEMICONDUCTOR CHIP AND MANUFACTURING METHOD THEREOF

(75) Inventors: Thorsten Meyer, Regensburg (DE); Ludwig Heitzer, Falkenfels (DE); Dominic Maier, Pleystein (DE)

(73) Assignee: Infineon Technologies AG, Neubiberg (DE)

( * ) Notice: Subject to any disclaimer, the term of this patent is extended or adjusted under 35 U.S.C. 154(b) by 188 days.

(21) Appl. No.: 12/712,889

(22) Filed: Feb. 25, 2010

(65) Prior Publication Data

US 2011/0204513 A1    Aug. 25, 2011

(51) Int. Cl.
*H01L 13/498* (2006.01)

(52) U.S. Cl.
USPC .............................. 257/738; 257/780; 257/786

(58) Field of Classification Search .................. 257/738, 257/E23.069, 676, 773, 780, 786
See application file for complete search history.

(56) References Cited

U.S. PATENT DOCUMENTS

| | | | |
|---|---|---|---|
| 5,497,033 A | 3/1996 | Fillion et al. | |
| 6,737,295 B2 | 5/2004 | Pendse et al. | |
| 6,841,454 B2 | 1/2005 | Nishiyama | |
| 6,845,554 B2 | 1/2005 | Frankowsky et al. | |
| 7,129,117 B2 | 10/2006 | Hsu | |
| 7,208,345 B2 | 4/2007 | Meyer et al. | |
| 7,274,099 B2 | 9/2007 | Hsu | |
| 7,517,722 B2 | 4/2009 | Goller et al. | |
| 2002/0048905 A1 | 4/2002 | Ikegami et al. | |
| 2002/0151189 A1 | 10/2002 | Pendse et al. | |
| 2002/0192867 A1 | 12/2002 | Nishiyama | |
| 2004/0043515 A1 | 3/2004 | Goller et al. | |
| 2004/0222440 A1 | 11/2004 | Pendse et al. | |
| 2006/0049530 A1 | 3/2006 | Hsu | |
| 2006/0094165 A1 | 5/2006 | Hedler et al. | |
| 2006/0258044 A1 | 11/2006 | Meyer et al. | |
| 2006/0258046 A1 | 11/2006 | Goller et al. | |
| 2006/0290010 A1 | 12/2006 | Hsu | |
| 2008/0164599 A1 | 7/2008 | Brunnbauer et al. | |
| 2009/0160053 A1 | 6/2009 | Meyer et al. | |
| 2010/0073663 A1 | 3/2010 | Meyer | |
| 2011/0156237 A1* | 6/2011 | Gulpen et al. | ................ 257/692 |

FOREIGN PATENT DOCUMENTS

| | | |
|---|---|---|
| DE | 101 57 280 A1 | 6/2003 |
| DE | 10 2004 052 921 A1 | 5/2006 |

OTHER PUBLICATIONS

Brunnbauer, M., et al., "Embedded Wafer Level Ball Grid Array (eWLB)," Electronics Packaging Technology Conference, Dec. 2006, pp. 1-5, IEEE, Singapore.

* cited by examiner

Primary Examiner — Tran Tran
(74) Attorney, Agent, or Firm — Slater & Matsil, L.L.P.

(57) ABSTRACT

A device includes a semiconductor chip having contact pads arranged on a first main face of the semiconductor chip. A first material has an elongation to break of greater than 35% covering the first main face of the semiconductor chip. An encapsulation body covers the semiconductor chip. A metal layer is electrically coupled to the contact pads of the semiconductor chip and extends over the encapsulation body.

24 Claims, 18 Drawing Sheets

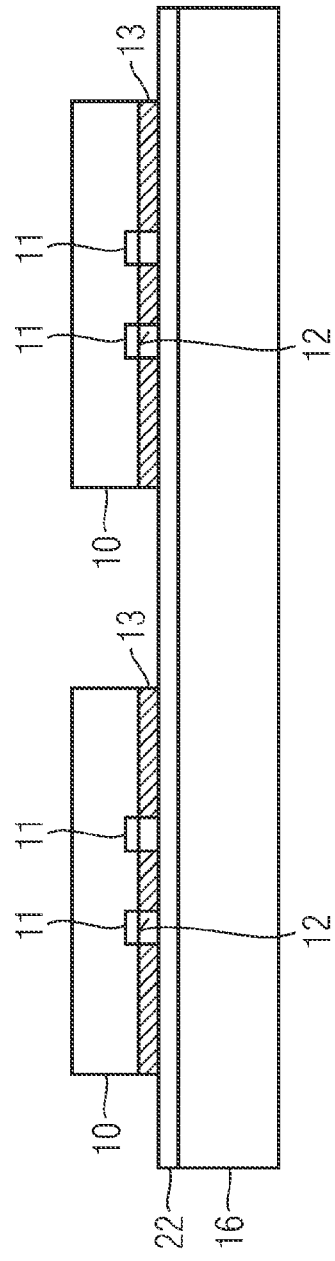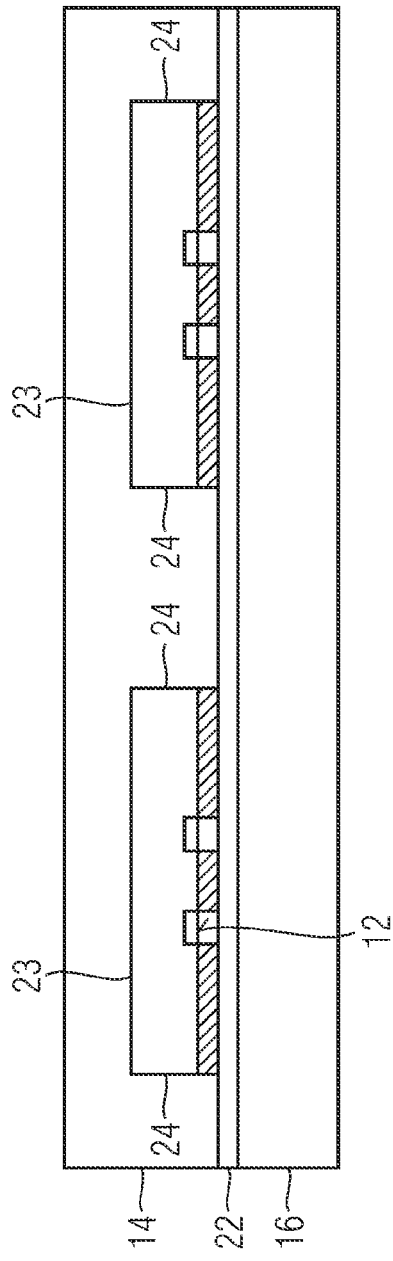

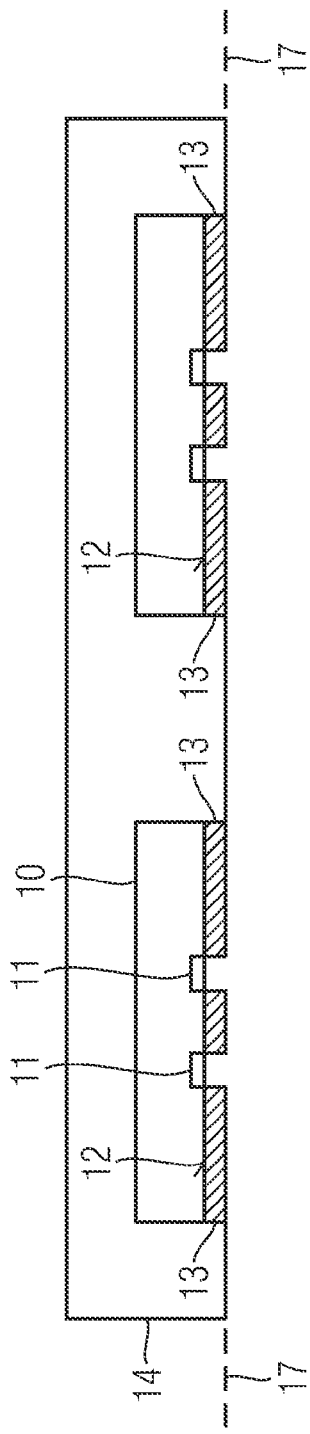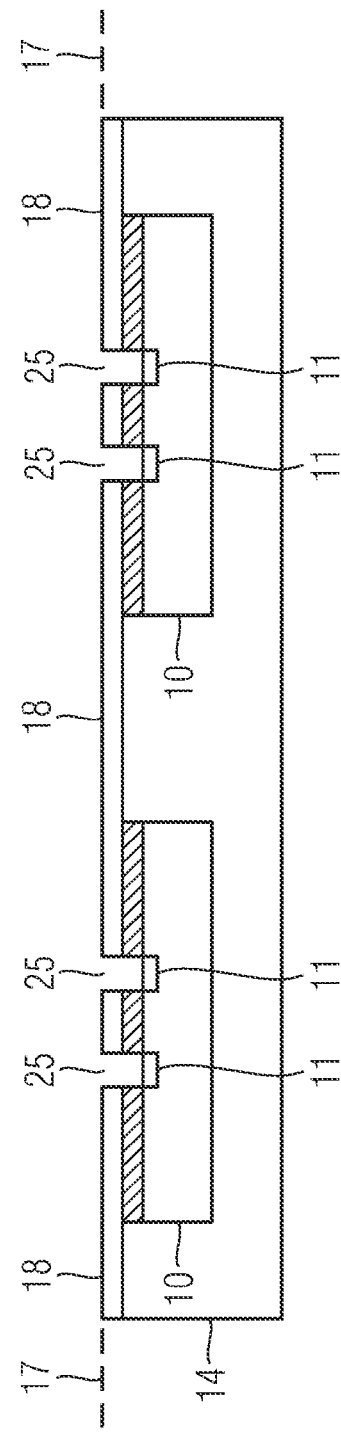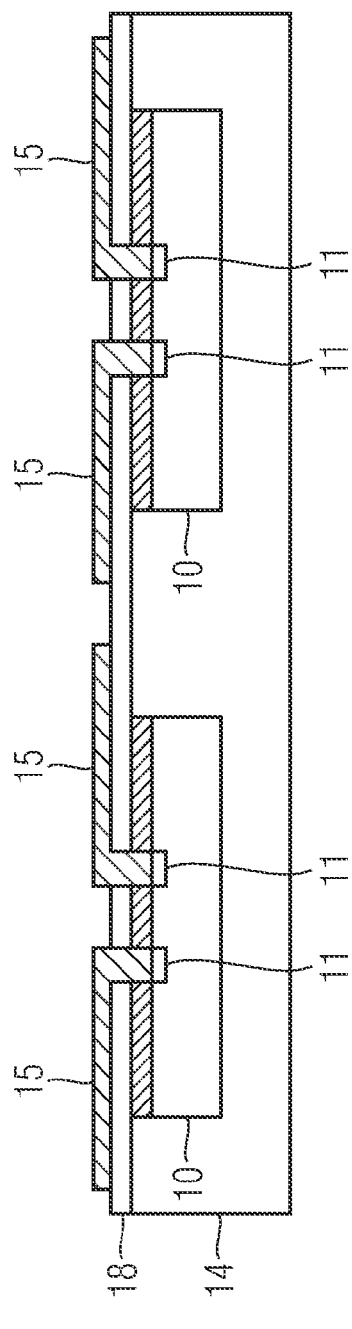

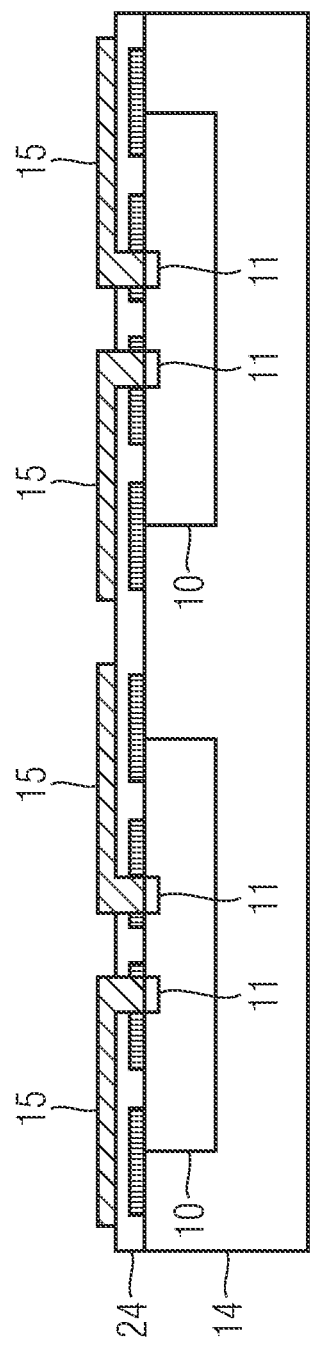
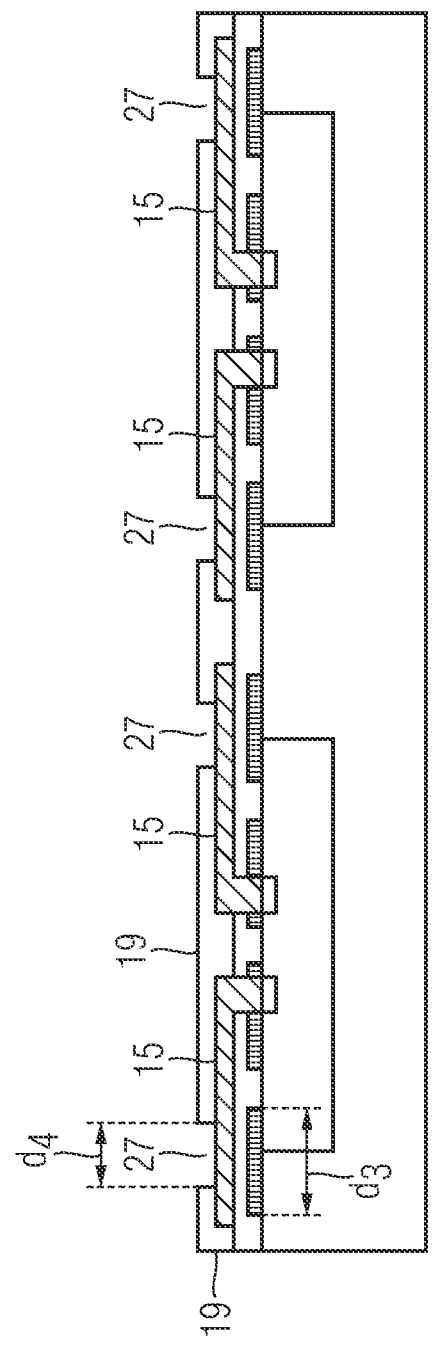
FIG 4H
FIG 4I

DEVICE INCLUDING AN ENCAPSULATED SEMICONDUCTOR CHIP AND MANUFACTURING METHOD THEREOF

TECHNICAL FIELD

Embodiments of the invention relate to a device including a semiconductor chip covered with an encapsulation material. Further embodiments relate to a method of manufacturing such a device.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. One or more semiconductor chips are placed in a package to protect them from environmental and physical stresses. Packaging semiconductor chips increases the cost and complexity of manufacturing semiconductor devices because the packaging designs shall not only provide protection, they shall also permit transmission of electrical signals to and from the semiconductor chips.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3A-3L schematically illustrate a cross-sectional view of an embodiment of a method;

FIGS. 4A-4L schematically illustrate a cross-sectional view of an embodiment of a method;

DETAILED DESCRIPTION OF ILLUSTRATIVE EMBODIMENTS

Figure 1:
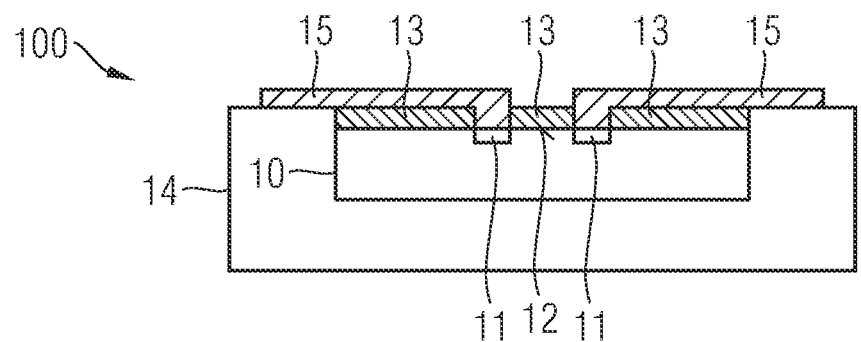
FIG. 1 schematically illustrates a cross-sectional view of one embodiment of a device.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones, etc. The semiconductor chips may be configured as antennas and/or discrete passives and/or chip stacks. Semiconductor chips in which such functional elements are embedded generally contain electronic circuits which serve for driving the functional elements or further process signals generated by the functional elements. The semiconductor chips need not be manufactured from specific semiconductor material, for example, Si, SiC, SiGe, GaAs, and, furthermore, may contain inorganic and/or organic materials that are not semiconductors, such as, for example, discrete passives, antennas, insulators, plastics or metals.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main faces of the semiconductor chips or on other faces of the semiconductor chips.

A material may be applied to the semiconductor chips that has an elongation to break of greater than 35%. The elongation to break is a material property and is the elongation recorded at the moment of rupture of a specimen made of the material the elongation to break of which to be measured. The elongation to break may be measured in a tensile test where a specimen made of the material to be measured is stretched.

The elongation to break A is then given by the following equation, where $L_0$ is the original length of the specimen without tension and $L_{rupture}$ is the length of the specimen recorded at the moment of rupture of the specimen and $\Delta L=L_{rupture}-L_0$ is the elongation at the moment of rupture:

$$A = \frac{L_{rupture} - L_0}{L_0} \cdot 100\% = \frac{\Delta L}{L_0} \cdot 100\% \tag{1}$$

According to equation (1), the elongation to break may be expressed as a percentage of the original length of the specimen. The material having an elongation to break of greater than 35% may be applied directly onto the face of the semiconductor chip where the contact pads are located. In one embodiment, the material covers the entire main surface of the semiconductor chip leaving only the contact elements and areas surrounding the contact elements exposed. In one embodiment, pads (or posts) made of the material having an elongation to break of greater than 35% are arranged on the surface of the semiconductor chip. The pads may be arranged in an array (or another arrangement). The elongation to break may also be greater than 40% or 50% or 60% or 70% or 80% or 90%. The material may be electrically insulating and may, for example, contain at least one of polyimide, silicone, epoxy, polyurethane, acrylonitrile butadiene styrene (ABS) and polyphenylenebenzobisoxazole (PBO) and may be filled with a suitable filler material or not. Note that not every material containing one of the aforementioned substances necessarily has an elongation to break of greater than 35%. In Table 1 examples of materials are given, which can be used here as the material having an elongation to break of greater than 35%:

TABLE 1

| Manufacturer | Product Name | Elomgation to break | Material Class |
|---|---|---|---|
| Asahi | Pimel I-8606 M | >50% | Polyimide |
| Fujifilm | Durimide 7520 | 85% | Polyimide |
| Fujifilm | Durimide 7320 | >70% | Polyimide |
| Hitachi-Du-Pont | HD8910 | 127% | PBO |
| Dow Corning | WL-5150 | 37.6% | Silicone |

The devices described below include external contact pads (or external contact elements), which may be of any shape and size. The external contact pads may be accessible from outside the devices and may thus allow electrical contact to be made with the semiconductor chips from outside the devices. Furthermore, the external contact pads may be thermally conducting and may serve as heat sinks for dissipating the heat generated by the semiconductor chips. The external contact pads may be composed of any desired electrically conductive material, for example, of a metal, such as copper, aluminum or gold, a metal alloy or an electrically conductive organic material. Solder material, such as solder balls or solder bumps, may be deposited on the external contact pads.

One or more metal layers having the shape of conductor lines (or conductor tracks) may be placed over the semiconductor chip. The metal layers may, for example, be used to produce a redistribution layer. The conductor lines may be employed as wiring layers to make electrical contact with the semiconductor chips from outside the device and/or to make electrical contact with other semiconductor chips and/or components contained in the device. The conductor lines may couple the contact pads of the semiconductor chips to the external contact pads. The conductor lines may be manufactured with any desired geometric shape and any desired material composition. Any desired metal, for example, aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers.

The semiconductor chips or at least parts of the semiconductor chips may be covered with an encapsulation material, which may be electrically insulating. The encapsulation material may be any appropriate duroplastic, thermoplastic or thermosetting material or laminate (prepreg) and may contain filler materials. Various techniques may be employed to encapsulate the semiconductor chips with the encapsulation material, for example, compression molding, injection molding, powder molding, liquid molding or lamination. Heat and/or pressure may be used to apply the encapsulation material.

The encapsulation material may be used to produce fan-out type packages. In a fan-out type package at least some of the external contact pads and/or conductor lines connecting the semiconductor chip to the external contact pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards, etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

FIG. 1 schematically illustrates a device 100 in cross section. The device 100 includes a semiconductor chip 10, which has contact pads 11 that are arranged on a first main face 12 of the semiconductor chip 10. A material 13 having an elongation to break of greater than 35% covers the first main face 12 of the semiconductor chip 10. Furthermore, an encapsulation body 14 covers the semiconductor chip 10. A metal layer 15 extends over the encapsulation body 14 and is electrically coupled to the contact pads 11 of the semiconductor chip 10.

Figure 2A:
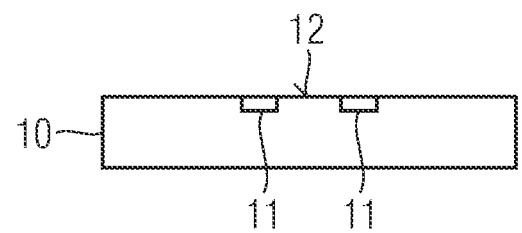
FIGS. 2A-2F schematically illustrate a cross-sectional view of an embodiment of a method of manufacturing a device.
Figure 2B:
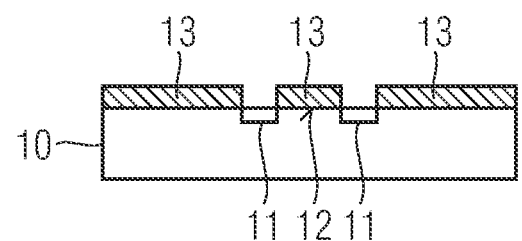
Figure 2C:
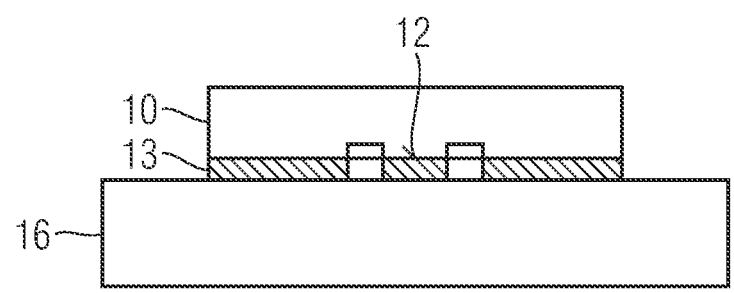
Figure 2D:
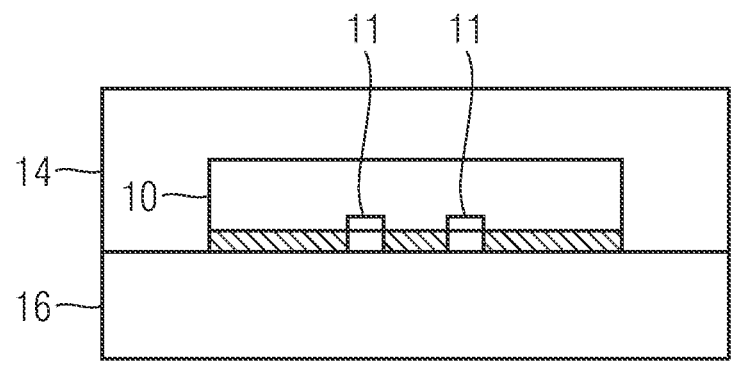
Figure 2E:
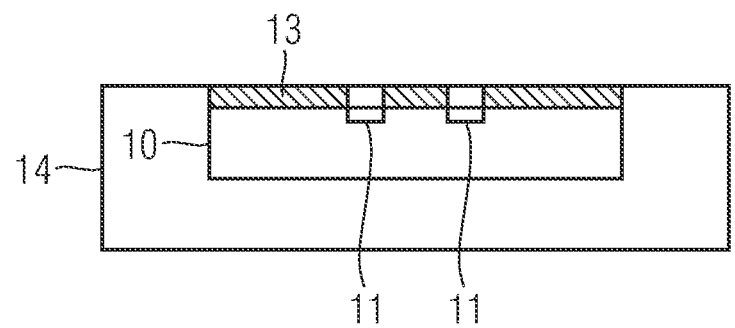
Figure 2F:
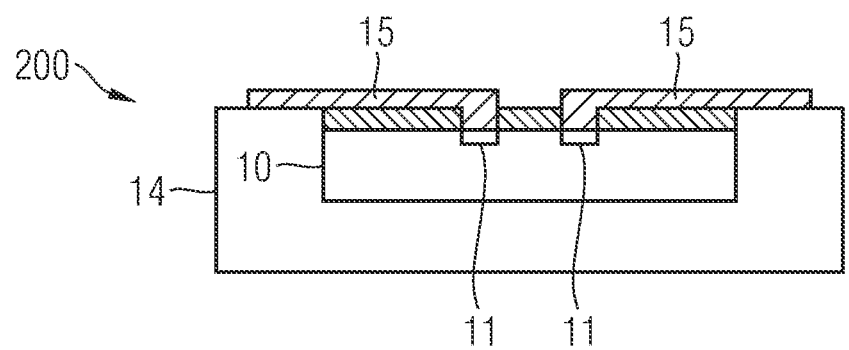

FIGS. 2A-2F schematically illustrate a method for manufacturing a device 200. A cross section of the device 200 obtained by the method is shown in FIG. 2F. A semiconductor chip 10 with contact pads 11 arranged on a first main face 12 of the semiconductor chip 10 is provided (see FIG. 2A). A material 13 having an elongation to break of greater than 35% is applied to the first main face 12 of the semiconductor chip 10 (see FIG. 2B). The semiconductor chip 10 is placed over a carrier 16 with the first main face 12 of the semiconductor chip 10 facing the carrier 16 (see FIG. 2C). The semiconductor chip 10 is then covered with an encapsulation material 14 (see FIG. 2D). The carrier 16 is removed after the semiconductor chip 10 has been covered with the encapsulation material 14 (see FIG. 2E). Optionally, a dielectric material may be applied to the semiconductor chip 10. A metal layer 15 is applied to the semiconductor chip 10 and the encapsulation material 14, wherein the metal layer 15 is electrically coupled to the contact pads 11 of the semiconductor chip 10 (see FIG. 2F).

Figure 3A:
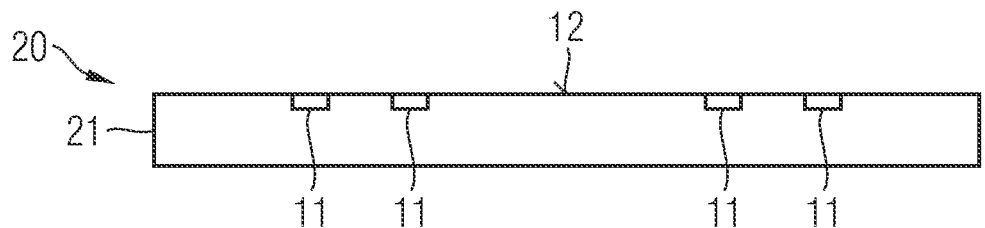
Figure 3B:
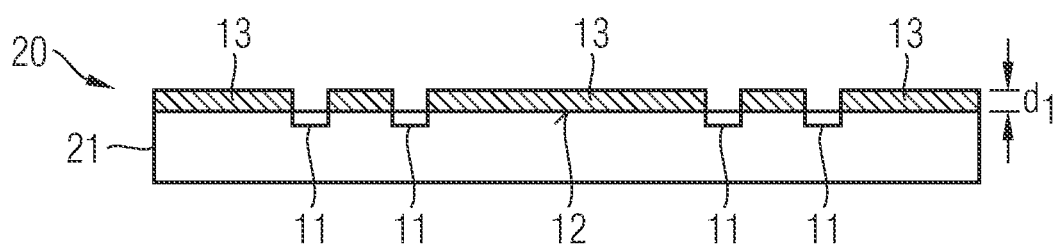
Figure 3C:
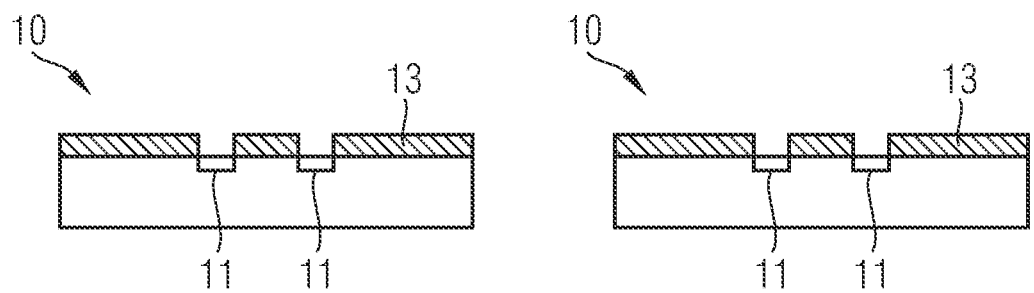
Figure 3J:
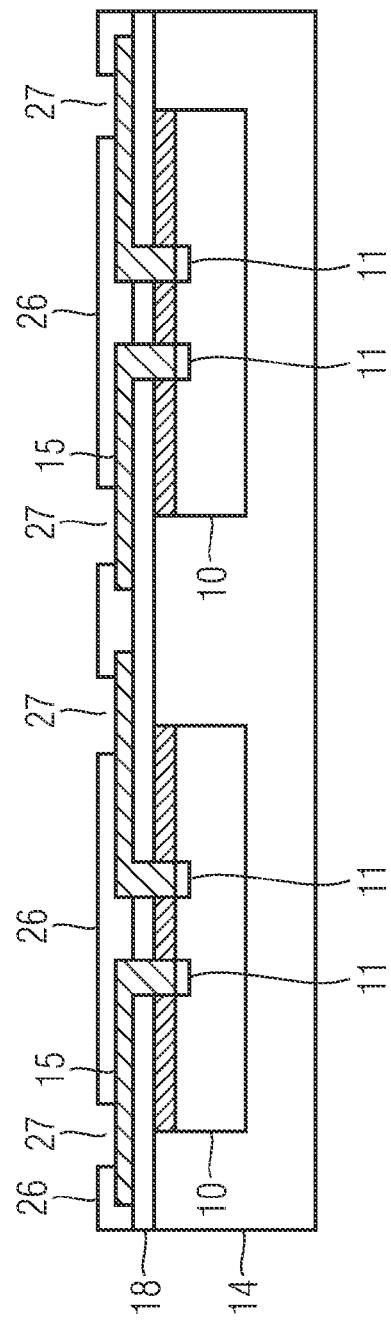
Figure 3K:
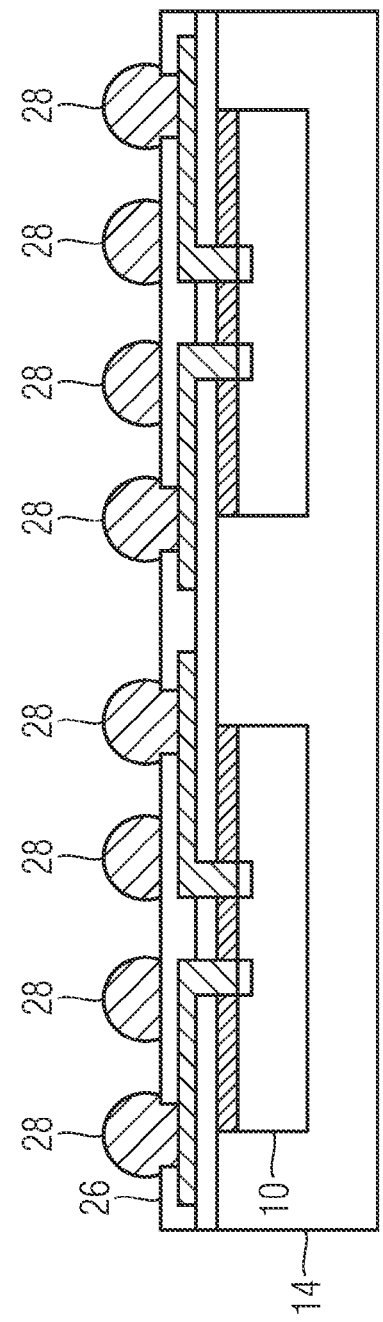
Figure 3L:
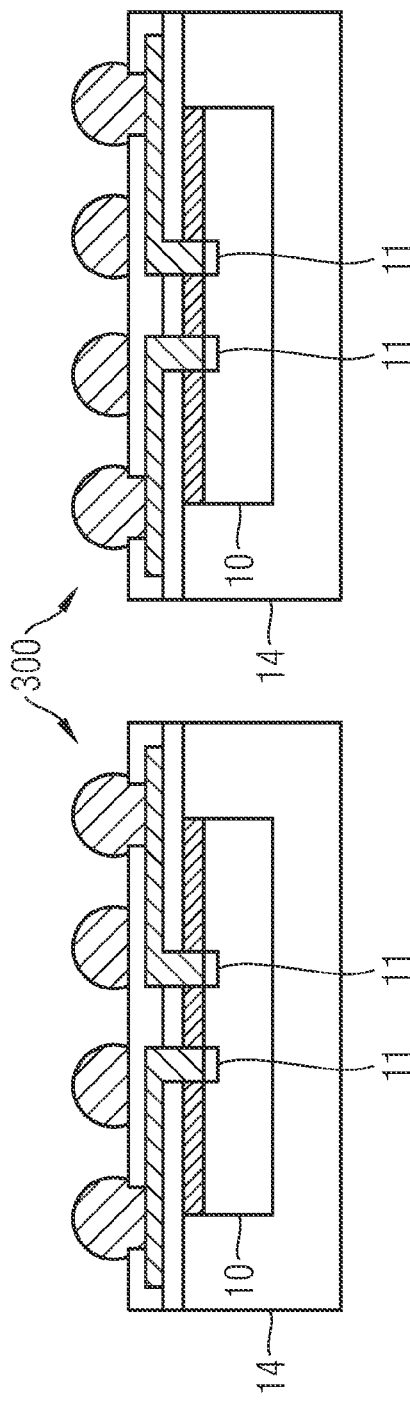

FIGS. 3A-3L schematically illustrate a method for manufacturing a device 300, a cross section of which is shown in FIG. 3L. The method shown in FIGS. 3A-3L is an implementation of the method shown in FIGS. 2A-2F. The details of the production method that are described below can therefore be likewise applied to the method of FIGS. 2A-2F. Furthermore, the device 300 is an implementation of the device 100. The details of the device 300 that are described below can therefore be likewise applied to the device 100.

The semiconductor chips 10 as well as all other semiconductor chips described herein may be fabricated on a wafer made of semiconductor material. Such a semiconductor wafer 20 is illustrated in FIG. 3A. The semiconductor wafer 20 may include a bulk silicon 21 in which integrated circuits are embedded. Contact pads 11 are located on a first main face 12 of the semiconductor wafer 20. The integrated circuits can be electrically accessed via the contact pads 11. The contact pads 11 may be made of a metal, for example, aluminum or copper, and may have any desired shape and size.

A material 13 having an elongation to break of greater than 35% may be deposited onto the first face 12 of the semiconductor wafer 20 as illustrated in FIG. 3B. The material 13 may be electrically insulating and may, for example, contain polyimide, silicone, epoxy, polyurethane, acrylonitrile butadiene styrene (ABS), polyphenylenebenzobisoxazole (PBS) or other appropriate materials. Examples of the material 13 are given in Table 1. The material 13 may be entirely made of one or more of the aforementioned materials or may be made of a combination of one or more of these materials and other materials. In any case the material 13 should have an elongation to break of greater than 35%. According to one embodiment, the elongation to break of the material 13 is greater than 40% or 50% or 60% or 70% or 80% or 90%. The elongation to break of the material 13 may be determined by using equation (1) as stated above.

The material 13 may be deposited by spin-coating, printing, lamination or any other suitable technique. The thickness $d_1$ of the layer of the material 13 may be in the range from 4 to 20 µm and, in particular, from 5 to 7 µm. If the material 13 is printed onto the first face 12 of the semiconductor wafer 20, the contact pads 11 may not be covered with the material 13. If spin-coating is employed as the deposition method, a photoresist layer may be deposited, for example spin-coated, on top of the layer of the material 13 (not illustrated). By exposure to light having a suitable wavelength through a mask and subsequent development, vias (recesses) are formed in the photoresist layer. Subsequently, the portions of the material 13 that are exposed by the vias may be removed by stripping away by using an appropriate solvent, if the photoresist material is of positive tone. If the photoresist material is of negative tone, not all exposed areas are removed by the solvent. The remaining layer of the material 13 has recesses which expose the contact pads 11 of the semiconductor wafer 20.

After the structuring of the material 13, the material 13 may be cured and thereby hardened during a heat-treatment. For this purpose the material 13 and the semiconductor wafer 20 may be exposed to an appropriate temperature. If, for example, the material 13 is made of polyimide, the temperature may be in the range from 360 to 380° C. The temperatures required for curing the material 13 can be higher than the temperatures a molding compound can stand. Therefore the material 13 may be deposited and cured before the encapsulation of the semiconductor chips 10 with the mold material as described below.

As illustrated in FIG. 3C, the semiconductor wafer 20 may then be singulated into the semiconductor chips 10 (only two of the semiconductor chips 10 are illustrated in FIG. 3C), for example, by sawing, cutting, etching or laser ablation.

In order to package the semiconductor chips 10, a carrier 16 is provided as illustrated in FIG. 3D. The carrier 16 may be a plate made of a rigid material, for example, a metal, such as nickel, steel or stainless steel, laminate, film or a material stack. The carrier 16 may have at least one flat surface on which components of the device 300 can be placed. The shape of the carrier 16 is not limited to any geometric shape, for example, the carrier 16 may be round or square-shaped. The carrier 16 may have any appropriate size. An adhesive tape 22, for example, a double sided sticky tape, may be laminated onto the carrier 16.

As illustrated in FIG. 3E, the semiconductor chips 10 are mounted on the carrier 16. The semiconductor chips 10 can be fixed on the adhesive tape 22. For attaching the semiconductor chips 10 to the carrier 16, other kinds of attaching materials may alternatively be used. The semiconductor chips 10 may be arranged in an array. Furthermore, any suitable array of the semiconductor chips 10 may be placed on the carrier 16 (only two of the semiconductor chips 10 are shown in FIG. 3E).

The semiconductor chips 10 are relocated on the carrier 16 in larger spacing as they have been in the wafer bond. The semiconductor chips 10 may have been manufactured on the same semiconductor wafer 20, but may alternatively have been manufactured on different semiconductor wafers. Furthermore, the semiconductor chips 10 may be physically identical, but may also contain different integrated circuits and/or represent other components. The semiconductor chips 10 may be arranged over the carrier 16 with their first main faces 12 containing the contact pads 11 facing the carrier 16. In this case the material 13 is in direct contact with the adhesive tape 22.

After the semiconductor chips 10 have been mounted on the carrier 16, they are encapsulated with an encapsulation material forming an encapsulation body 14 as illustrated in FIG. 3F. The encapsulation material may cover the second main faces 23 of the semiconductor chips 10, which are opposite to the first main faces 12, and also the side faces 24 of the semiconductor chips 10. The gaps between the semiconductor chips 10 are also filled with the encapsulation material. For example, the encapsulation material may be a duroplastic or thermosetting mold material. The encapsulation material may be based on an epoxy material and may contain a filling material consisting of small particles of glass ($SiO_2$) or other electrically insulating mineral filler materials like $Al_2O_3$ or organic filler materials. The mold material may, for example, be applied by compression molding, injection molding, granulate molding, powder molding or liquid molding.

According to one embodiment, a polymer material is used to encapsulate the semiconductor chips 10 and to form the encapsulation body 14. The polymer material may have the shape of an electrically insulating foil or sheet, which is laminated on top of the semiconductor chips 10 as well as the carrier 16. Heat and pressure may be applied for a time suitable to attach the polymer foil or sheet to the underlying structure. The gaps between the semiconductor chips 10 are also filled with the polymer material. The polymer material may, for example, be a prepreg (short for preimpregnated fibers) that is a combination of a fiber mat, for example, glass or carbon fibers, and a resin, for example, a duroplastic material. Prepreg materials are usually used to manufacture PCBs (printed circuit boards). Well known prepreg materials that are used in PCB industry and that can be used here as the polymer material are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 10 and hardened during a heat-treatment. For the lamination of the prepreg the same or similar process steps can be used as in PCB manufacturing.

The semiconductor chips 10 encapsulated in the encapsulation body 14 are released from the carrier 16, and the adhesive tape 22 is pealed from the material 13 as well as from the encapsulation material 14 as illustrated in FIG. 3G. The adhesive tape 22 may feature thermo-release properties, which allow the removal of the adhesive tape 22 during a heat-treatment. The removal of the adhesive tape 22 from the carrier 16 is carried out at an appropriate temperature, which depends on the thermo-release properties of the adhesive tape 22 and is usually higher than 150° C.

After the release of the carrier 16 and the adhesive tape 22 the face of the material 13 facing away from the semiconductor chip 10 as well as the bottom surface of the encapsulation body 14 form a substantially common plane 17. The plane 17 may include steps which can have a height of up to 10 µm. In particular, a step may occur at the interface between the semiconductor chip 10 and the encapsulation body 14. The plane 17 is substantially coplanar to the first main face 12 of the semiconductor chips 10. As described below and illustrated in FIGS. 3H-3K, a redistribution layer may be applied to the plane 17.

A dielectric layer 18 may be deposited on the plane 17 as illustrated in FIG. 3H. The dielectric layer 18 may be fabricated in various ways. For example, the dielectric layer 18 may be deposited from a gas phase or from a solution, or can be laminated onto the surface 17. Furthermore, thin-film technology methods or a standard PCB industry process flow can be used for the application of the dielectric layer 18. The dielectric layer 18 may be fabricated from a polymer, such as parylene, photoresist material, imide, epoxy, duroplast, silicone, silicon nitride or an inorganic, ceramic-like material, such as silicone-carbon compounds. The thickness of the dielectric layer 18 may be up to 10 µm or even higher. The dielectric layer 18 may also be omitted.

In order to make electrical contacts to the integrated circuits embedded in the semiconductor chips 10, the dielectric layer 18 may be opened in areas where the contact pads 11 are arranged as illustrated in FIG. 3H. The openings 25 in the dielectric layer 18 may, for example, be produced by using photolithographic methods and/or etching methods.

During the molding process for forming the encapsulation body 14, the semiconductor chips 10 may be laterally shifted for up to a certain distance 1, which may be in the range of ±15 µm. In one embodiment, the openings in the material 13 that expose the contact pads 11 of the semiconductor chips 10 have dimensions which are larger than the openings 25 in the dielectric layer 18 by at least the distance 1. This ensures that the entire surface of each opening 25 exposes surface area of the respective contact pad 11.

A metal layer 15 is applied to the dielectric layer 18 and is structured as illustrated in FIG. 3I. According to one embodiment, a seed layer possibly consisting of two different layers is applied. The first part of the seed layer is a barrier layer, which, for example, consists of titanium, titanium tungsten or palladium and is first deposited on the upper surface of the dielectric layer 18 and the exposed contact pads 11. The deposition of the barrier layer may be carried out by electroless deposition from a solution or by sputtering. The barrier layer may have a thickness in the range from 10 to 80 nm, in particular, around 50 nm.

The thickness of the seed layer may be increased by depositing a further metal layer onto the barrier layer. The barrier layer can be used as an electrode for a galvanic deposition of the further metal layer. The top part of the seed layer may, for example, be made of copper and may have a thickness in the range from 100 to 200 nm.

A photoresist layer may be printed, electro-deposited or spin-coated on top of the seed layer (not illustrated). By exposure to light having a suitable wavelength through a mask and subsequent development or laser application, recesses are formed in the photoresist layer. Subsequently, the portion of the seed layer exposed by the recesses may be reinforced by galvanic deposition of a metallic material. During the galvanic deposition of the metallic material, the seed layer is employed as an electrode. Copper or other metals or metal alloys may be plated onto the seed layer in the unmasked areas and to the desired height, which is usually greater than 3 µm.

After the plating of the metal layer 15 the photoresist layer is stripped away by using an appropriate solvent. The now exposed portions of the original seed layer, which have not been covered with the metal layer 15, may be removed by a brief etching step thereby creating separated conductor lines as illustrated in FIG. 3I.

A dielectric layer 26 may be deposited on top of the metal layer 15 and may be opened in certain areas to expose portions of the metal layer 15 as illustrated in FIG. 3J. The exposed portions of the metal layer serve as external contact pads 27. The dielectric layer 26 may be produced by using the same or similar materials and processing steps as described above in connection with the dielectric layer 18. The dielectric layer 26 may have the function of a solder stop layer.

Solder deposits 28 may be placed onto the external contact pads 27 as illustrated in FIG. 3K. The solder deposits 28 may be applied to the external contact pads 27 by so-called "ball placement", in which pre-shaped balls composed of solder material are applied to the external contact pads 27. As an alternative to "ball placement", the solder deposits 28 may, for example, be applied by means of stencil printing with a solder paste, followed by a heat-treatment process. The solder material may be formed from metal alloys which are composed, for example, from the following materials: SnPb, SnAg, SnAgCu, SnAgCuNi, SnAu, SnCu and SnBi. The solder deposits 28 may be used to electrically couple the devices 300 to other components, for example, a PCB. The solder deposits 28 are electrically coupled to the contact pads 11 of the semiconductor chips 10 via the metal layer 15.

As illustrated in FIG. 3L, the devices 300 are separated from one another by separation of the encapsulation body 14 and possibly the redistribution layer, for example, by sawing, cutting, etching or a laser beam.

The devices 300 manufactured by the method described above may be fan-out type packages. The encapsulation body 14 allows the redistribution layer to extend beyond the outline of the semiconductor chips 10. The external contact pads 27 therefore do not need to be arranged within the outline of the semiconductor chips 10, but can be distributed over a larger area. The increased area which is available for arrangement of the external contact pads 27 as a result of the encapsulation body 14 means that the external contact pads 27 cannot only be arranged at a great distance from one another, but that the maximum number of external contact pads 27 which can be arranged there is likewise increased compared to the situation when all the external contact pads 27 are arranged within the outline of the semiconductor chips 10.

It is obvious to a person skilled in the art that the device 300 shown in FIG. 3L and the manufacturing thereof as described above are only intended to be an exemplary embodiment, and many variations are possible. Each of the devices 300 described above contains a single semiconductor chip. Alternatively, two or more semiconductor chips or passives of different types may be included in the same device 300. The semiconductor chips and passives may differ in function, size, manufacturing technology etc.

Furthermore, the redistribution layer may contain more than one metal layer. The metal layers may be stacked on top of each other, and dielectric layers may be arranged between adjacent metal layers.

Figure 4A:
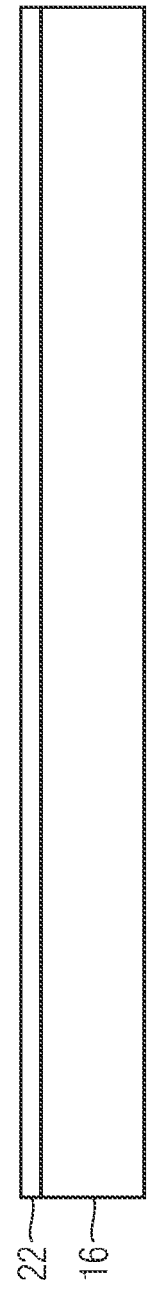
Figure 4B:
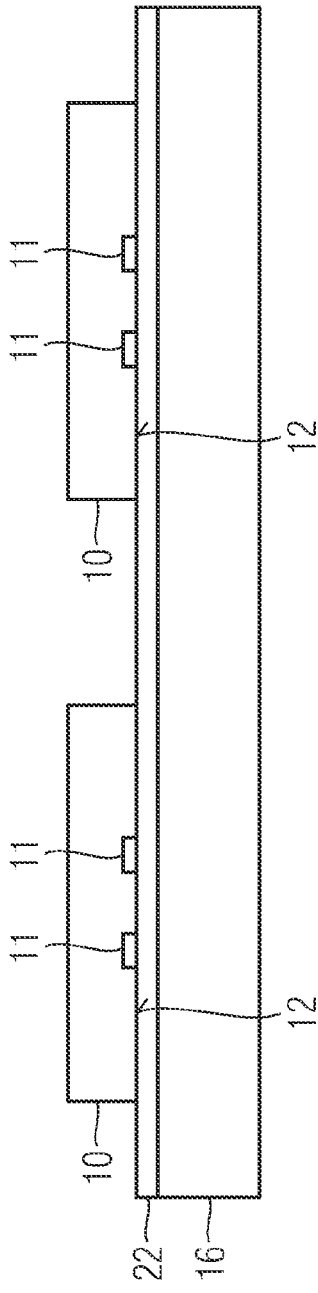
Figure 4C:
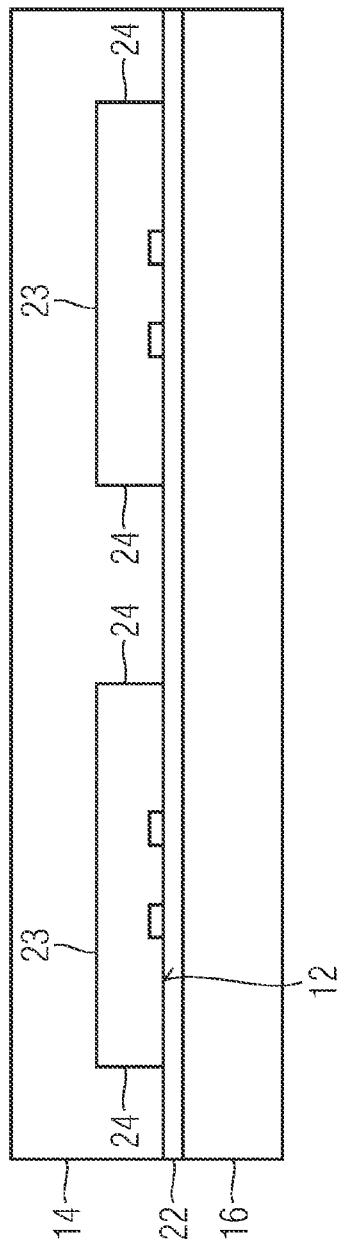
Figure 4D:
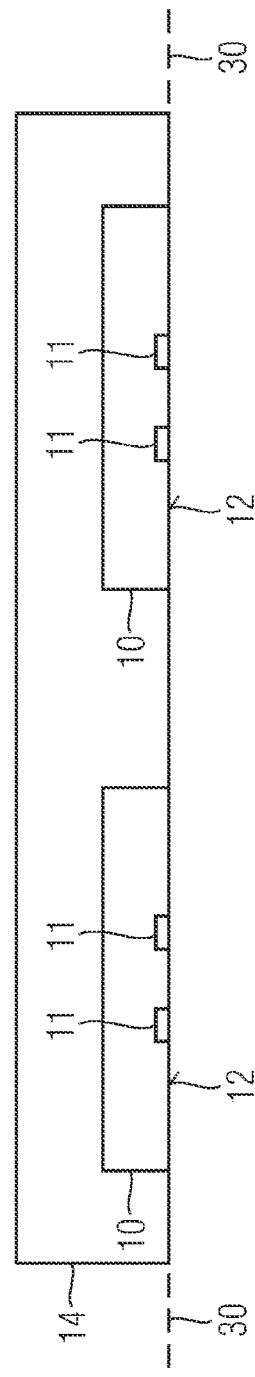
Figure 4E:
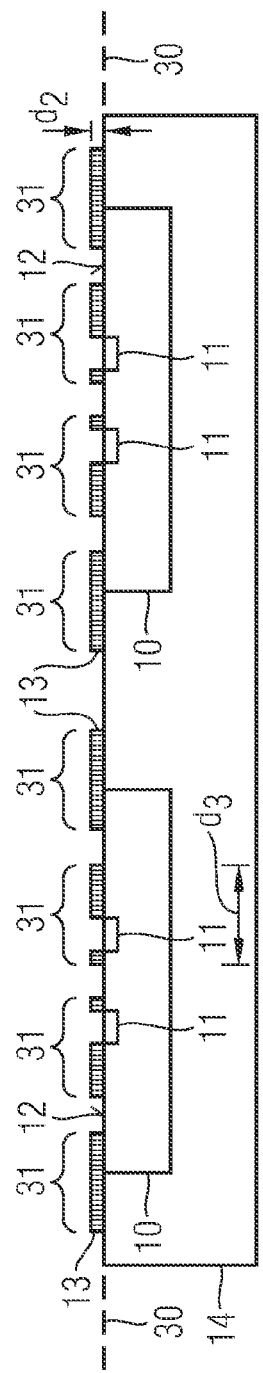
Figure 4F:
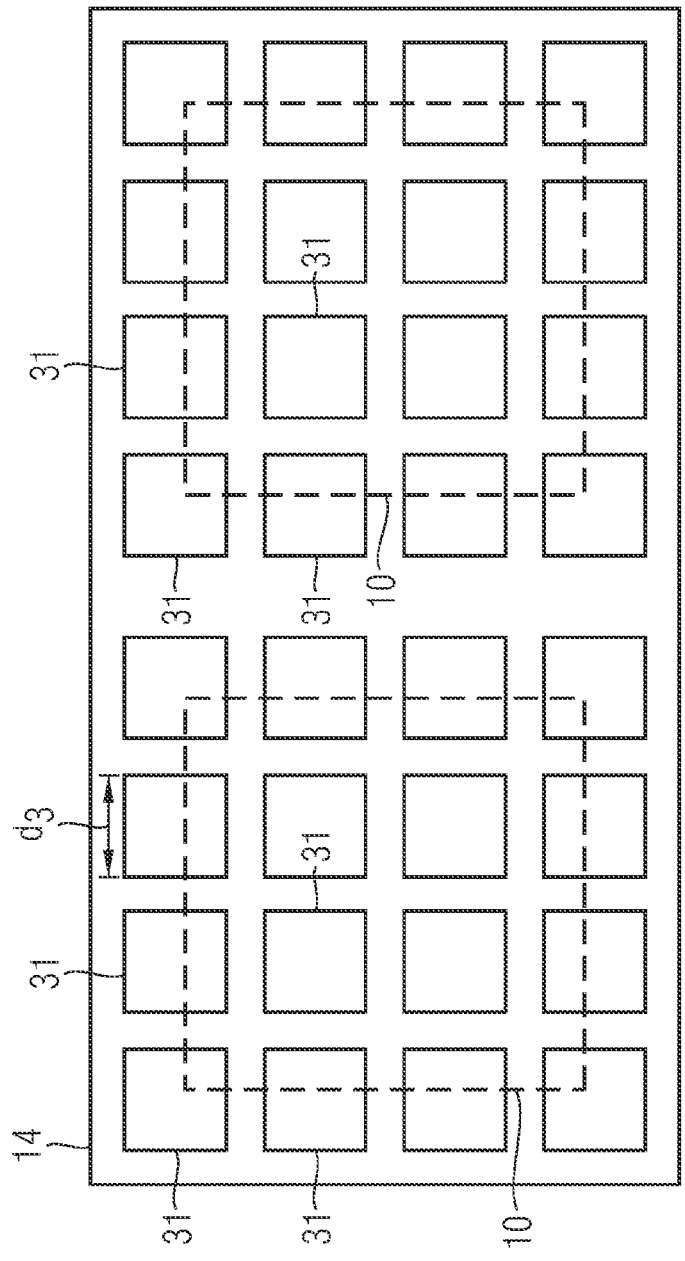
Figure 4G:
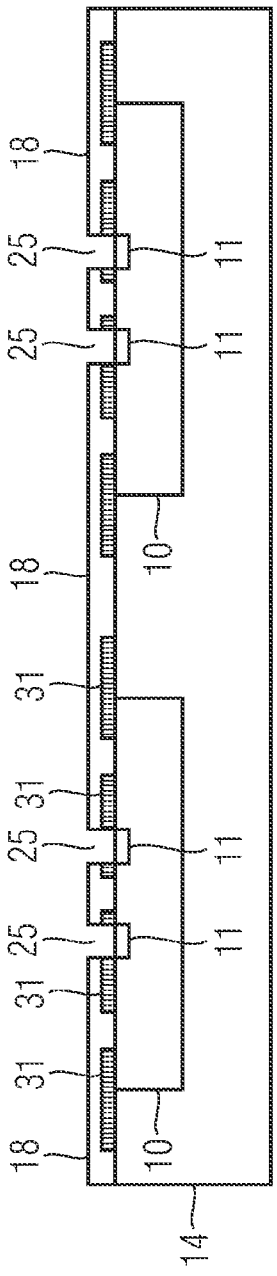
Figure 4J:
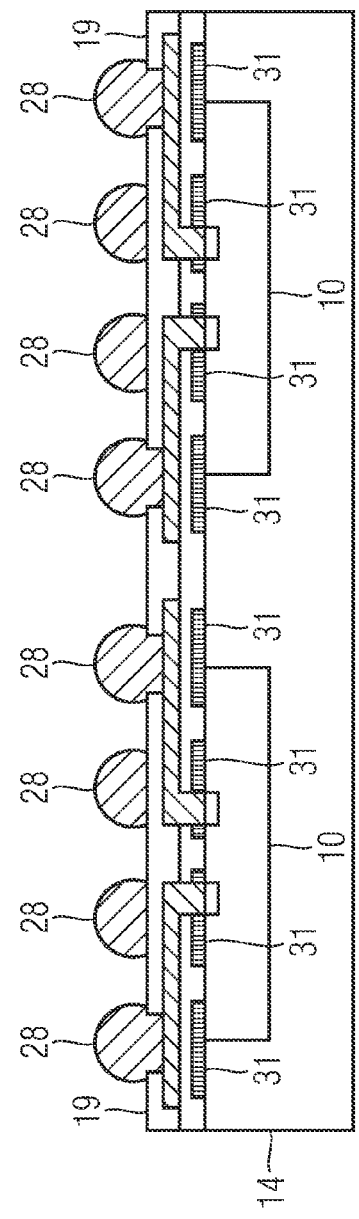
Figure 4K:
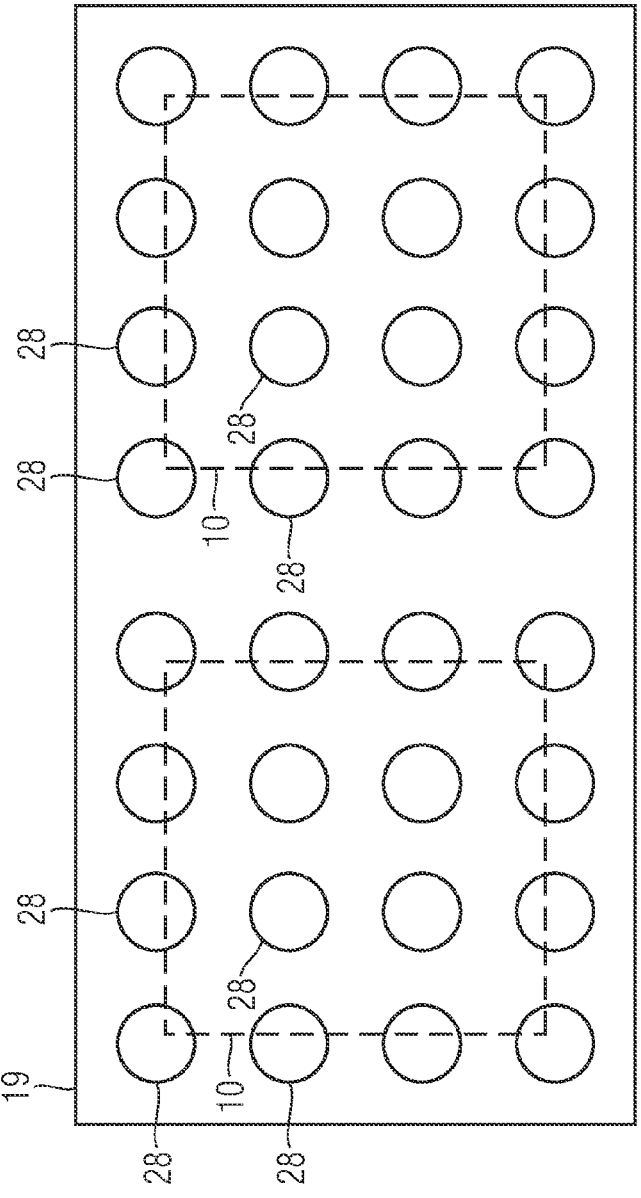
Figure 4L:
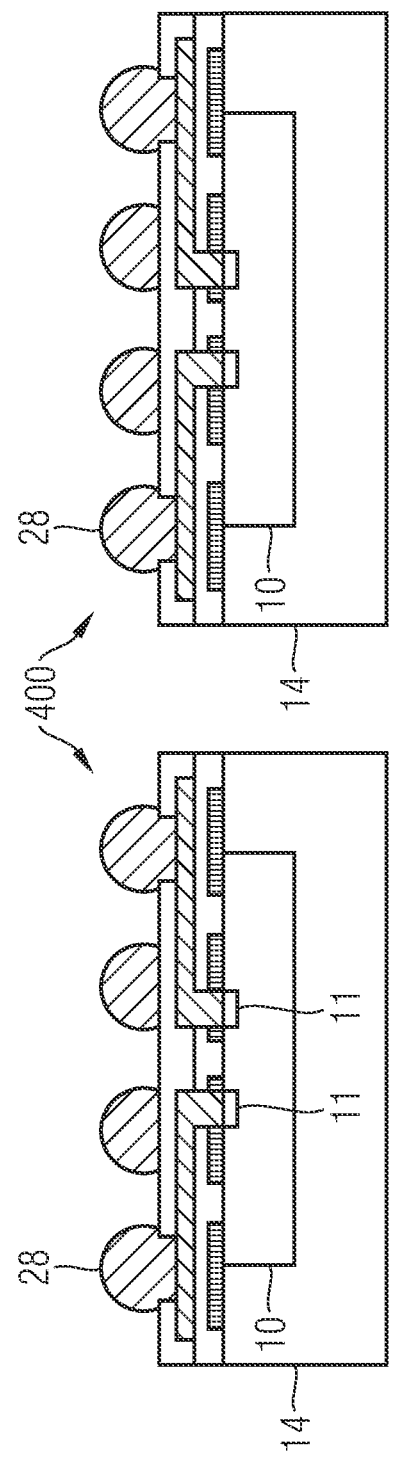

FIGS. 4A-4L schematically illustrate a method for manufacturing a device 400, a cross section of which is shown in FIG. 4L. The method shown in FIGS. 4A-4L is a variation of the method shown in FIGS. 3A-3L. Many of the manufacturing steps of the method presented below are similar or identical to the manufacturing steps described above. Therefore it is referred to the description of the method of FIGS. 3A-3L in the following where appropriate.

As illustrated in FIG. 4A, a carrier 16 together with an adhesive tape 22 is provided, which are identical to the carrier 16 and the adhesive tape 22 described above in connection with FIG. 3D.

The semiconductor chips 10 are mounted on the carrier 16 with their first main faces 12 facing the carrier 16 as illustrated in FIG. 4B. In contrast to the embodiment of FIG. 3E, the first main faces 12 of the semiconductor chips 10 are not covered with the material 13. Thus the bare faces 12 are in contact with the adhesive tape 22.

The second main faces 23 opposite to the first main faces 12 and the side faces 24 of the semiconductor chips 10 are then covered by the encapsulation body 14 as illustrated in FIG. 4C and described above in connection with FIG. 3F. Subsequently, the carrier 16 and the adhesive tape 22 are removed as described above in connection with FIG. 3G. After the removal of the carrier 16, the bottom face of the encapsulation body 14 as illustrated in FIG. 4D and the first main faces 12 of the semiconductor chips 10 form a substantially common plane 30. The plane 30 may include steps which can have a height of up to 10 µm. In particular, a step may occur at the interface between the semiconductor chip 10 and the encapsulation body 14.

In the present embodiment, pads (or posts) 31 made of the material 13 are applied to the plane 30. The pads 31 may be deposited over the first main faces 12 of the semiconductor chips 10 as well as the encapsulation body 14. The material 13 of the pads 31 may have the same properties as described above in connection with FIG. 3B. In particular, the material 13 may have an elongation to break of greater than 35% or 40% or 50% or 60% or 70% or 80% or 90%. The material 13 may be electrically insulating and may, for example, contain polyimide, silicone, epoxy, polyurethane, acrylonitrile butadiene styrene (ABS), polyphenylenebenzobisoxazole (PBS) or other appropriate materials. Examples of the material 13 are given in Table 1.

The pads 31 may be deposited by printing, in particular, screen printing, or spin-coating and subsequent structuring or other appropriate techniques. The thickness $d_2$ of the pads 31 may be in the range from 4 to 20 µm. The pads 31 may be arranged in an array (or any other arrangement) as schematically illustrated in FIG. 4F where a plan top view of the encapsulation body 14 of FIG. 4E is shown. For the ease of understanding, FIG. 4E only shows the positions of the pads 31. The outlines of the semiconductor chips 10 are indicated by dashed lines. The pads 31 are placed at those positions where the external contact pads 27 and the solder deposits 28 are placed later on. The pads 31 may have a rectangular shape or square shape as in FIG. 4F, but other shapes, for example, a round shape, are possible as well. If the position of a pad 31 overlaps with the position of a contact pad 11, the pad 31 has a recess to expose the contact pad 11 as illustrated exemplarily in FIG. 4E. The recess of the pad 31 may be larger than the area of the contact pad 11.

According to one embodiment, the pads 31 made of the material 13 are deposited when the semiconductor chips 10 are still in the wafer bond (similar to FIG. 3B). In this case no pads 31 are deposited on the encapsulation body 14.

A redistribution layer including a dielectric layer 18, a metal layer 15 and a solder stop layer 19 may be subsequently deposited as illustrated in FIGS. 4G-4I. The features and deposition methods of these layers may be identical to the corresponding layers described above in connection with FIGS. 3H-3J.

The external contact pads 27, which are formed by recesses in the solder stop layer 19 and the underlying structured metal layer 15, may have a round shape and may have a diameter $d_4$, which is in the range from 200 to 350 µm. The diameter $d_4$ of the external contact pads 27 may be smaller than the side length $d_3$ of the pads 31 made of the material 13. It may be provided that a respective pad 31 is arranged below every external contact pad 27. Furthermore, each external contact pad 27 may be positioned such that it does not extend beyond the outline of the respective pad 31 as exemplarily indicated in FIG. 4I for one pair of external contact pad 27 and corresponding pad 31 by dashed lines. The square-shaped outline of each pad 31 may be concentric with the round outline of the respective external contact pad 27.

In one embodiment, adjacent external contact pads 27 have a midpoint-to-midpoint distance of 0.4 mm, the diameter $d_4$ of the external contact pads 27 is 240 µm and the pads 31 have a side length $d_3$ in the range from 240 to 280 µm. In another embodiment, adjacent external contact pads 27 have a midpoint-to-midpoint distance of 0.5 mm, the diameter $d_4$ of the external contact pads 27 is 280 µm and the pads 31 have a side length $d_3$ in the range from 280 to 340 µm.

Solder deposits 28 may be placed onto the external contact pads 27 as illustrated in FIG. 4J. The solder deposits 28 may be solder balls as described above in connection with FIG. 3K.

FIG. 4K illustrates a top plan view of the encapsulation body 14 of FIG. 4J. The external contact pads 27 and the solder balls 28 placed on the external contact pads 27 are arranged in the same array (or, in general, the same arrangement) as the pads 31 of FIG. 4F. The outlines of the semiconductor chips 10 are indicated by dashed lines in FIG. 4K.

As illustrated in FIG. 4L, the devices 400 are separated from one another by separation of the encapsulation body 14 and the redistribution layer, for example, by sawing, cutting, etching or a laser beam.

Figure 5A:
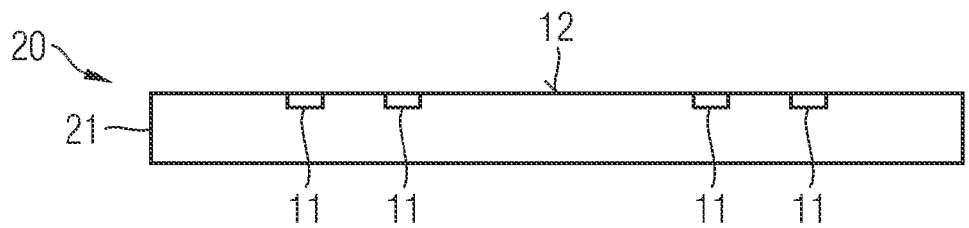
FIGS. 5A-5N schematically illustrate a cross-sectional view of an embodiment of a method.
Figure 5B:
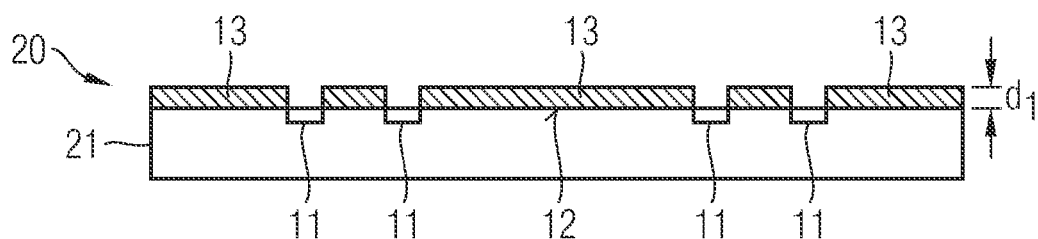
Figure 5C:
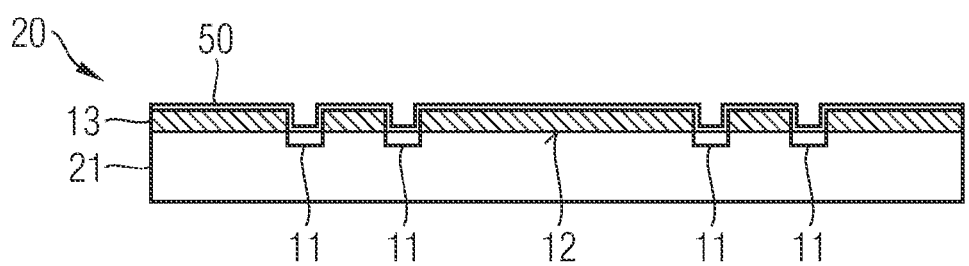
Figure 5D:
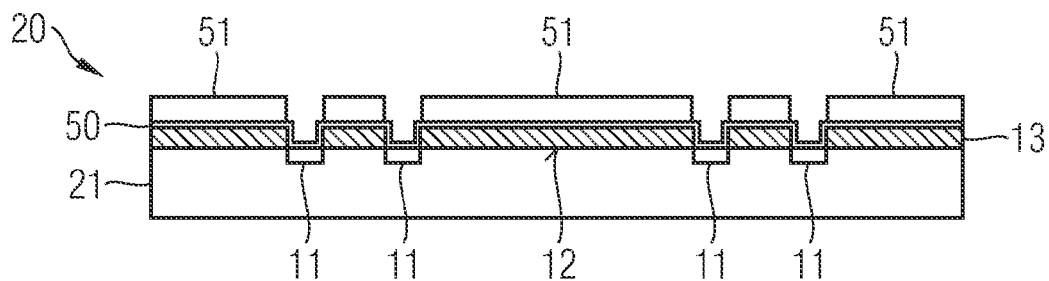
Figure 5E:
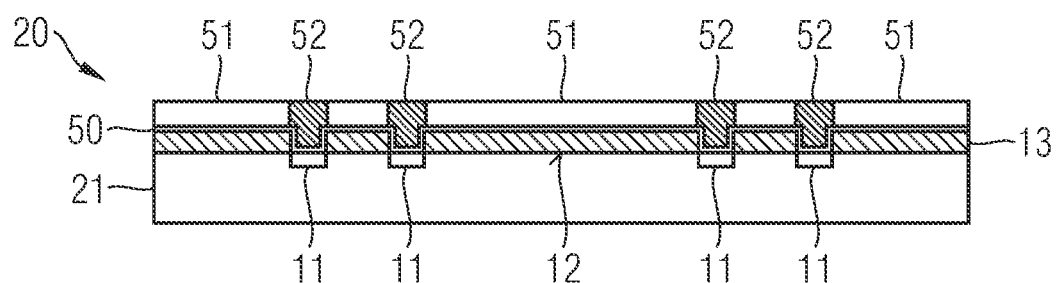
Figure 5F:
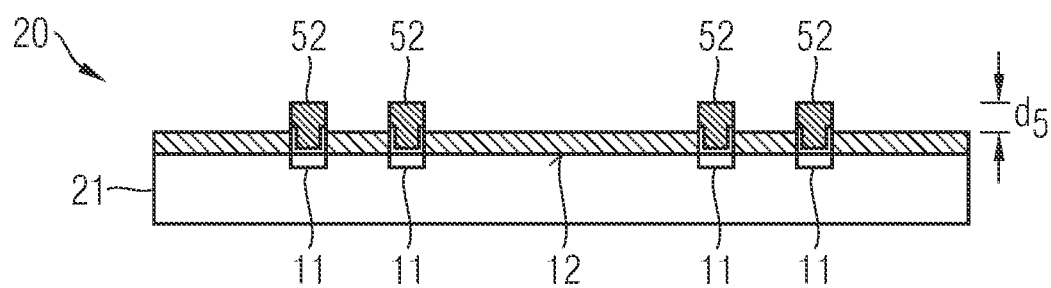
Figure 5G:
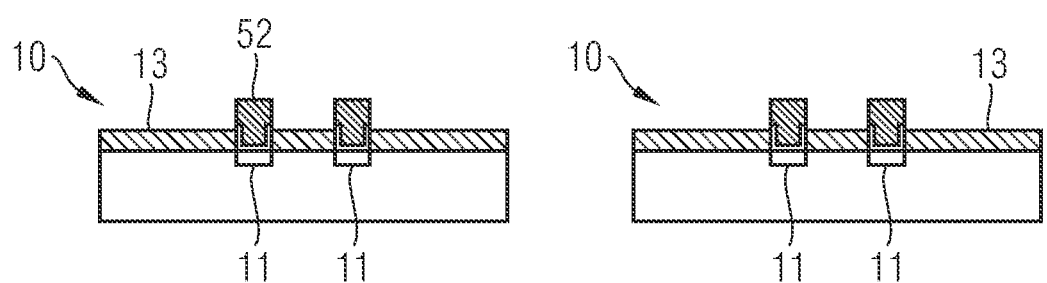
Figure 5H:
Figure 5I:
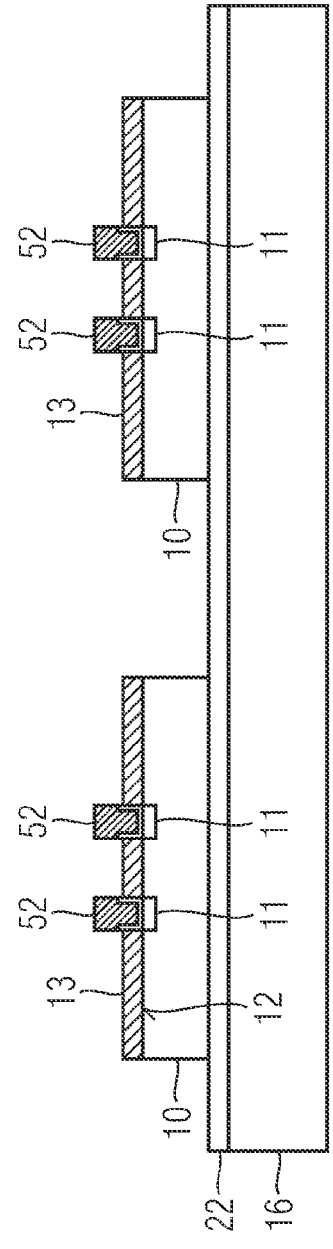
Figure 5J:
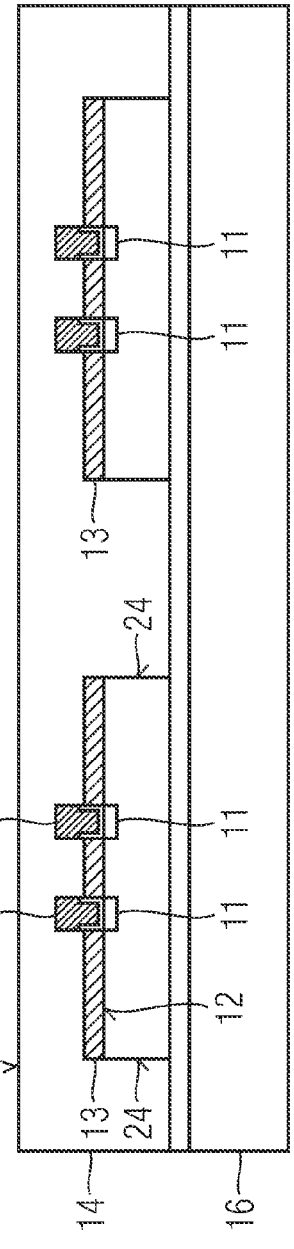
Figure 5K:
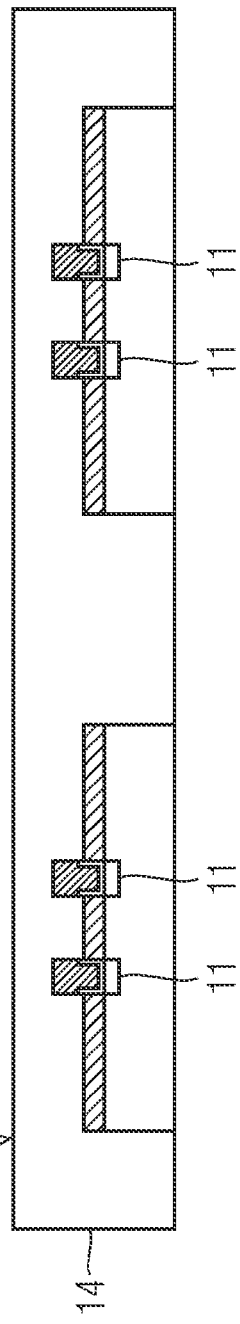
Figure 5L:
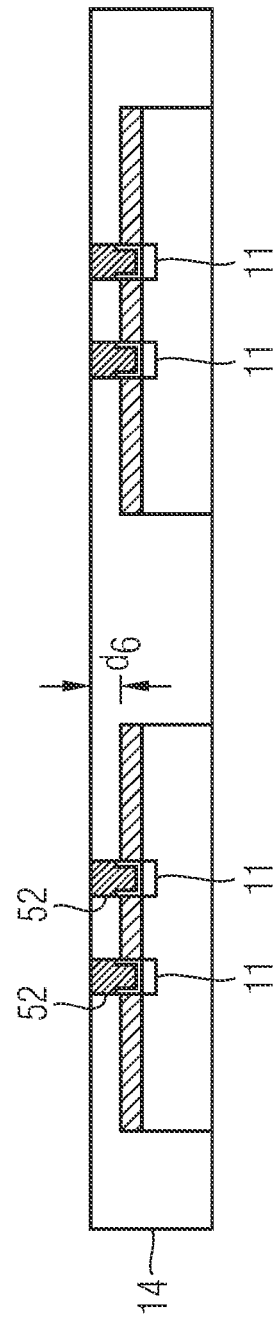
Figure 5M:
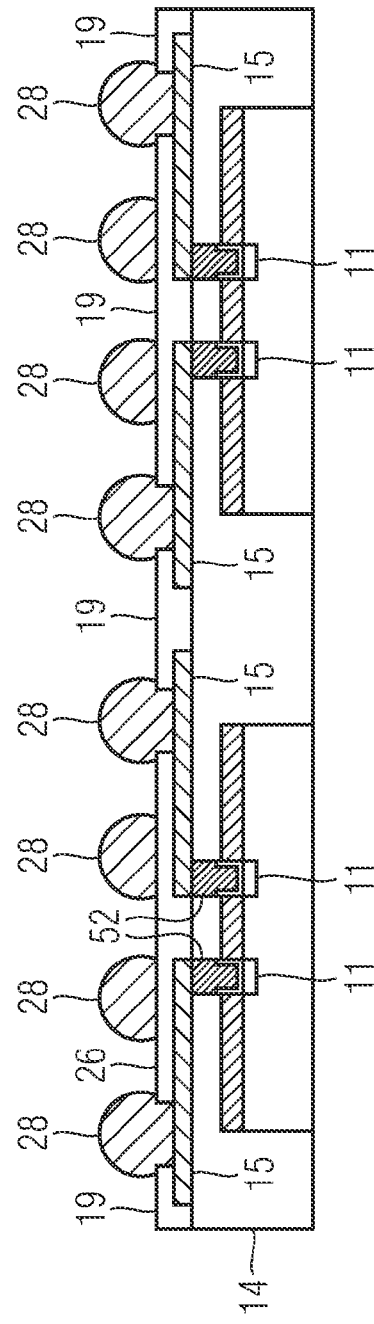
Figure 5N:
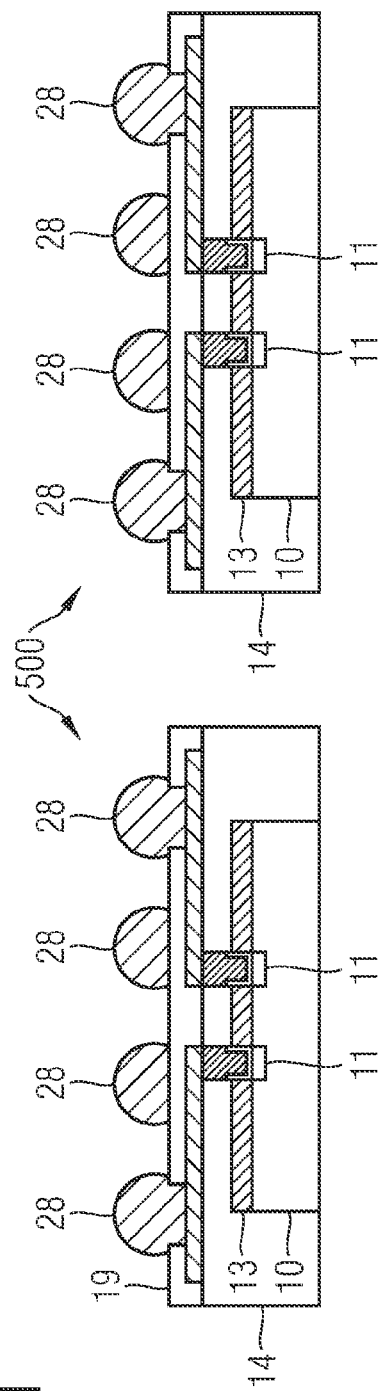

FIGS. 5A-5N schematically illustrate a method for manufacturing a device 500, a cross section of which is shown in FIG. 5N. The method shown in FIGS. 5A-5N is a variation of the method shown in FIGS. 3A-3L. Many of the manufacturing steps of the method presented below are similar or identical to the manufacturing steps described above. Therefore it is referred to the description of the method of FIGS. 3A-3L in the following where appropriate.

FIG. 5A schematically illustrates a semiconductor wafer 20 having contact pads 11 on its first main face 12. Similar or identical to FIG. 3B, a material 13 having an elongation to break of greater than 35% may be deposited onto the first main face 12 of the semiconductor wafer 20 as illustrated in FIG. 5B. Recesses may be formed in the layer of the material 13 that expose the contact pads 11 of the semiconductor wafer 20.

As schematically illustrated in FIG. 5C, a seed layer 50 may be deposited on the top surface of the material 13 and the exposed surfaces of the contact pads 11. The deposition of the seed layer 50 may be similar or identical to the deposition of the seed layer described above in connection with FIG. 3I.

FIG. 5D shows that a plating resist 51 may be deposited onto the seed layer 50. The plating resist 51 may have openings in the areas of the contact pads 11 of the semiconductor wafer 20. The portions of the seed layer 50 exposed by the openings in the plating resist 51 may be reinforced by galvanic deposition of a metallic material as illustrated in FIG. 5E. During the galvanic deposition of the metallic material, the seed layer is employed as an electrode. Copper or other metals or metal alloys may be plated onto the seed layer in the unmasked areas and to the desired height, which is usually greater 3 μm. The plating process produces metallic stands (or posts or protrusions) 52 protruding from the contact pads 11 of the semiconductor wafer 20.

The plating resist 51 may then be removed and the portions of the seed layer 50 which are exposed by removing the plating resist 51 may be etched. As illustrated in FIG. 5F, the stands 52 may have a height $d_5$ in the range from 1 to 40 μm and, in particular, from 20 to 40 μm.

In one embodiment, the stands 52 are produced by stud bumping. The stud bumps 52 are placed on the contact pads 11 through a modification of the "ball bonding" process used in conventional wire bonding. In ball bonding, the tip of the bond wire is melted to form a sphere. The wire bonding tool presses this sphere against the contact pad of the semiconductor chip to be connected, applying mechanical force, heat and/or ultrasonic energy to create a metallic connection. The wire bonding tool next extends the wire to the contact pad on the board, substrate or leadframe and makes a "stitch" bond to that pad, finishing by breaking off the bond wire to begin another cycle. For stud bumping, the first ball bond is made on a contact pad 11 of the semiconductor wafer 20 as described, but the wire is then broken close above the ball. The resulting ball or "stud bump" 52 remaining on the contact pad 11 provides a permanent, reliable connection to the underlying electrically conductive material of the contact pad 11.

As illustrated in FIG. 5G, the semiconductor wafer 20 may be diced thereby separating the individual semiconductor chips 10. Similar to FIGS. 3D and 3E, a carrier 16 is provided and the semiconductor chips 10 are mounted on the carrier 16 by means of an adhesive tape 22, for example, a double sided sticky tape, which may be laminated onto the carrier 16 as illustrated in FIGS. 5H and 5I. In contrast to FIG. 3E, however, the semiconductor chips 10 are mounted on the carrier 16 such that their first main faces 12 and the stands 52 face away from the carrier 16.

After the semiconductor chips 10 have been mounted on the carrier 16, they are encapsulated with an encapsulation material forming an encapsulation body 14 as described above in connection with FIG. 3F and illustrated in FIG. 5J. The encapsulation material covers the first main surfaces 12 including the material 13, the side faces 24 of the semiconductor chips 10 as well as the stands 52. The encapsulation body 14 containing the semiconductor chips 10 is then released from the carrier 16 as illustrated in FIG. 5K.

The encapsulation body 14 may be thinned by mechanically removing encapsulation material from the upper surface 53 of the encapsulation body 14 as illustrated in FIG. 5L. Grinding machines may be used that are similar or identical to the machines used for semiconductor wafer grinding. Alternatively, milling or polishing, such as chemical mechanical polishing, may be used to reduce the thickness of the encapsulation body 14.

Thinning is carried out until the upper surfaces of the stands 52 are exposed. It is also possible that the heights of the stands 52 are reduced when thinning the encapsulation body 14. At the end, the stands 52 may have a height $d_6$ of less than 20 μm, in particular, less than 10 or 5 μm. As a result of the thinning, the upper surface 53 of the encapsulation body 14 is substantially flush with the upper surfaces of the stands 52. The term "flush" is here not meant mathematically and may include micro-steps in the range up to several micrometers. Thus, the upper surfaces of the encapsulation body 14 and the stands 52 form a substantially common plane on which a redistribution layer can be applied.

The redistribution layer is illustrated in FIG. 5M and may be applied as described above in connection with FIGS. 3I-3K. Subsequently the individual devices 500 are separated from each other by dicing the encapsulation body 14, illustrated in FIG. 5N.

Figure 6:
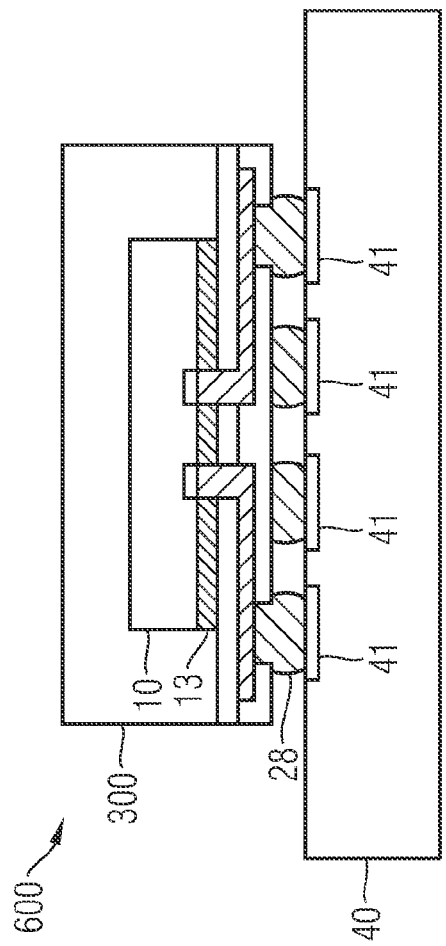
FIG. 6 schematically illustrates a cross-sectional view of one embodiment of a system including a circuit board and a device mounted on the circuit board.

The devices 100, 200, 300, 400 and 500 may be mounted on circuit boards. In FIG. 6 a system 600 is exemplarily illustrated which contains the device 300 mounted on a circuit board 40, for example, a PCB. The circuit board 40 may have contact pads 41, and the device 300 may be soldered to the contact pads 41 by means of the solder balls 28.

Figure 7:
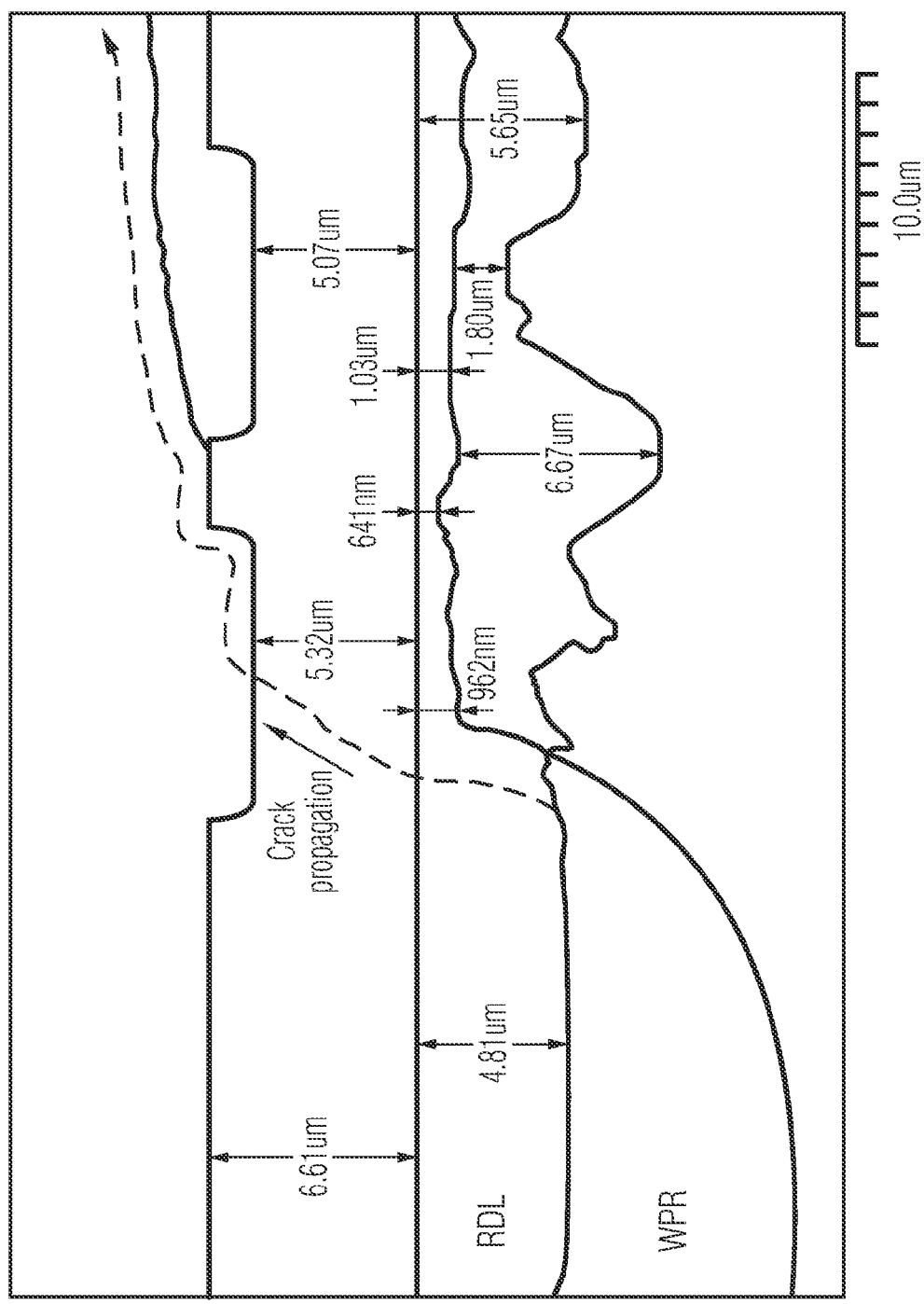
FIG. 7 illustrates a crack in a conventional device due to the mismatch in the thermal expansion coefficient between semiconductor chip and solder ball.

The mismatch in the thermal expansion coefficient between the semiconductor chips and the solder balls may locally cause stress, in particular, in temperature cycle tests. The highest stress occurs at the interface between the external contact pad and the solder balls. In conventional devices this stress may cause cracks in the copper. Exemplarily such a crack in a conventional device is shown in FIG. 7. The crack starts in the copper layer, then passes through the dielectric layer and extends into the chip passivation. In the devices 100 to 500 described above the material 13 acts as a buffer between the semiconductor chips and the solder balls due to the high elongation to break of the material 13 and prevents thus the formation of cracks.

In addition, while a particular feature or aspect of an embodiment of the invention may have been disclosed with respect to only one of several implementations, such features or aspects may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
   a semiconductor chip comprising contact pads having an external surface at a first main face of the semiconductor chip;

a dielectric layer disposed over the first main face of the semiconductor chip;

insulating pads disposed in the dielectric layer and comprising a material having an elongation to break of greater than 35%, the material of the insulating pads being different from a material of the dielectric layer, the insulating pads and the dielectric layer covering the first main face of the semiconductor chip, wherein the insulating pads are arranged on the semiconductor chip in an array or other arrangement;

an encapsulation body covering the semiconductor chip;

a metal layer electrically coupled to the contact pads of the semiconductor chip and extending over the encapsulation body; and a plurality of solder deposits, wherein each of the insulating pads is arranged directly below each deposit of the plurality of solder deposits.

2. The device of claim 1, wherein at least one of the plurality of solder deposits is arranged outside of an outline of the semiconductor chip.

3. The device of claim 1, wherein the solder deposits comprise solder balls.

4. The device of claim 3, wherein the metal layer electrically couples the contact pads of the semiconductor chip to the solder balls.

5. The device of claim 1, wherein the semiconductor chip comprises a second main face opposite to the first main face and side faces extending from the first main face to the second main face and wherein the encapsulation body entirely covers the side faces of the semiconductor chip.

6. The device of claim 5, wherein the encapsulation body is in direct contact with the second main face and the side faces of the semiconductor chip.

7. The device of claim 1, wherein the material having an elongation to break of greater than 35% is made of at least one of polyimide, silicone, epoxy, polyurethane, acrylonitrile butadiene styrene and polyphenylenebenzobisoxazole.

8. The device of claim 1, wherein a face of the material having an elongation to break of greater than 35% and a face of the encapsulation material define a substantially common plane and the metal layer is arranged parallel to the substantially common plane.

9. The device of claim 1, wherein the first main face of the semiconductor chip and a face of the encapsulation material define a substantially common plane and the insulating pads are arranged directly on the substantially common plane.

10. The device of claim 9, wherein the metal layer is arranged parallel to the substantially common plane.

11. The device of claim 1, wherein a respective external contact pad is arranged over each of the insulating pads made of the material having an elongation to break of greater than 35%.

12. The device of claim 11, wherein a respective solder ball is arranged over at least one of the external contact pads.

13. A device, comprising:
a semiconductor chip comprising contact pads arranged on a first main face of the semiconductor chip;
a dielectric layer disposed over the semiconductor chip and the contact pads;
insulating pads disposed in the dielectric layer, the insulating pads arranged on the first main face of the semiconductor chip in an array, the insulating pads being made of a material having an elongation to break of greater than 35% and different from the dielectric layer;
an encapsulation body covering the semiconductor chip;

a metal layer electrically coupled to the contact pads of the semiconductor chip and extending over the encapsulation body; and
solder balls arranged in an array over the insulating pads, wherein each of the insulating pads is arranged directly below each of the solder balls.

14. A device, comprising:
a semiconductor chip comprising a first main face, a second main face opposite to the first main face and side faces extending from the first main face to the second main face;
contact pads disposed within the semiconductor chip;
a dielectric layer disposed over the semiconductor chip and the contact pads;
insulating pads disposed in the dielectric layer, the insulating pads comprising a material having an elongation to break of greater than 35% and different from the dielectric layer, the insulating pads disposed in a plane over the contact pads and partially covering the first main face of the semiconductor chip, wherein the insulating pads are arranged on the semiconductor chip in an array or other arrangement;
an encapsulation body covering the side faces of the semiconductor chip;
a redistribution layer comprising a conductive line electrically coupled to the contact pads of the semiconductor chip and extending over the encapsulation body; and
solder balls deposited over the redistribution layer, wherein each of the pads is arranged directly below each of the solder balls, wherein the metal line extends from one of the solder balls over a first pad of the insulating pads and extends through an opening in a second pad of the insulating pads to contact a pad of the contact pads.

15. The device of claim 1, wherein a first pad of the pads overlaps over a first contact pad of the contact pads, and wherein the first pad has a recess to expose the first contact pad.

16. The device of claim 13, wherein a first pad of the pads overlaps over a first contact pad of the contact pads, and wherein the first pad has a recess to expose the first contact pad.

17. The device of claim 14, wherein a first pad of the pads overlaps over a first contact pad of the contact pads, and wherein the first pad has a recess to expose the first contact pad.

18. A device, comprising:
a semiconductor chip comprising a first main face, a second main face opposite to the first main face and side faces extending from the first main face to the second main face with contact pads arranged on the first main face of the semiconductor chip;
a dielectric layer disposed on the first main face;
posts disposed in the dielectric layer, the posts being a different material from the dielectric layer, the posts comprising a material having an elongation to break of greater than 35%, wherein the posts are arranged in a first pattern;
an encapsulation body covering the side faces of the semiconductor chip;
a redistribution layer electrically coupled to the contact pads of the semiconductor chip and extending over the encapsulation body; and
solder balls deposited over the redistribution layer, the solder balls arranged in a second pattern, wherein the first pattern is about the same as the second pattern.

19. The device of claim 18, wherein each of the posts is arranged directly below each of the solder balls.

20. The device of claim 19, wherein the total number of the posts is the same as the total number of the solder balls.

21. The device of claim 19, wherein the material of the posts comprises polyurethane.

22. The device of claim 19, wherein the material of the posts comprises polyphenylenebenzobisoxazole.

23. The device of claim 19, wherein the material of the posts comprises polyimide, silicone, epoxy, or acrylonitrile butadiene styrene.

24. The device of claim 1, further comprising a second dielectric layer over the dielectric layer, the second dielectric layer comprising openings for the plurality of solder deposits.

* * * * *